United States Patent [19]

Mashiko et al.

[11] Patent Number: 4,641,281

[45] Date of Patent: Feb. 3, 1987

[54] DYNAMIC RANDOM ACCESS MEMORY WITH HIDDEN REFRESH CONTROL

[75] Inventors: Koichiro Mashiko; Michihiro Yamada, both of Takarazuka; Kazutami Arimoto, Itami; Hiroshi Miyamoto, Toyonaka; Toshifumi Kobayashi; Yoshikazu Morooka, both of Itama, all of Japan

[73] Assignee: Mitsubishi Denki Kabushiki Kaisha, Tokyo, Japan

[21] Appl. No.: 638,675

[22] Filed: Aug. 8, 1984

[30] Foreign Application Priority Data

Aug. 26, 1983 [JP] Japan ................. 58-156701

[51] Int. Cl.$^4$ .............................................. G11C 7/00
[52] U.S. Cl. .................................... 365/189; 365/222
[58] Field of Search ....................... 365/189, 222, 230; 330/297

[56] References Cited

U.S. PATENT DOCUMENTS 4,396,845  8/1983  Nakano ................................ 365/230

Primary Examiner—James W. Moffitt
Attorney, Agent, or Firm—Birch, Stewart, Kolasch & Birch

[57] ABSTRACT

A dynamic random access memory that contains a memory cell array including a plurality of memory cells includes a pre-amplifier intended to amplify data which is read out from a memory cell accessed by an address signal; a main-amplifier intended to amplify the output of the pre-amplifier and output the amplified signal; and a driver circuit intended to output a driving signal for driving the main-amplifier, the driver circuit includes a first and a second transistor, wherein a drain of the first transistor is connected to a node corresponding to an output terminal of the driver circuit, with a source of the first transistor being earthed and with a gate thereof being connected to the drain of the second transistor, and wherein a gate of the second transistor is connected to the node with a source thereof being earthed.

1 Claim, 26 Drawing Figures

F I G. 6.
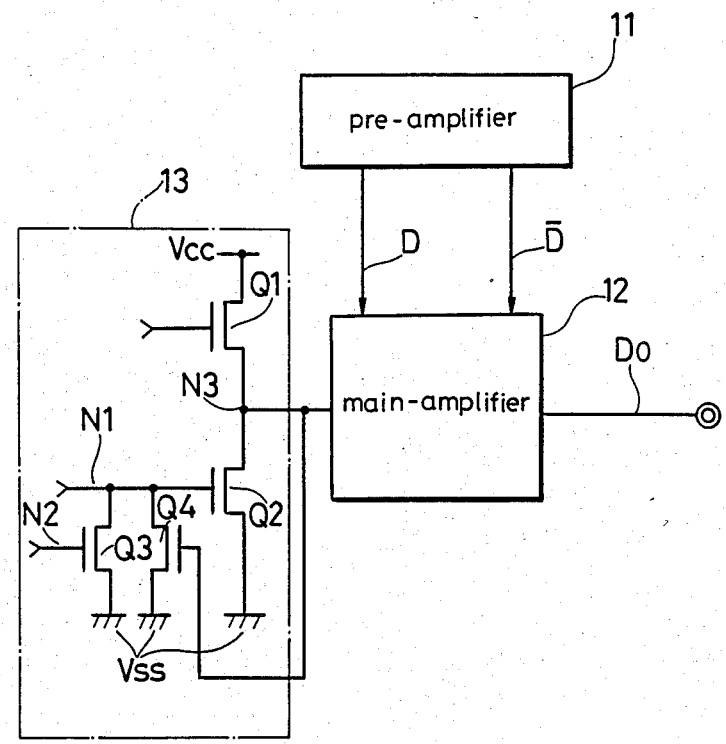

DYNAMIC RANDOM ACCESS MEMORY WITH HIDDEN REFRESH CONTROL

FIELD OF THE INVENTION

The present invention relates to a dynamic random access memory (hereinafter referred to as a "d-RAM"), and more particularly to a d-RAM which is capable of maintaining the level of output data during a hidden-refresh operation.

BACKGROUND OF THE INVENTION

In order to explain the background of the invention, reference will be particularly made to FIG. 1. The reference numeral 11 designates a pre-amplifier intended to amplify data which is read out from a memory cell accessed by an address signal from the outside. The detailed construction thereof is shown in FIG. 2. The reference numeral 12 designates a main-amplifier intended to amplify the output of the pre-amplifier 11, and output the amplified signal as an output data Do. The detailed construction thereof is shown in FIG. 3.

The reference numeral 13 designates a driver circuit intended to output a driving signal for driving the main-amplifier 12 to the node N3. In the driver circuit 13 which is constituted by internal transistors Q1, Q2, Q3 and internal nodes N1, N2, the drain of the transistor Q1 is connected to the power supply (Vcc) terminal, and the source thereof is connected to the third node N3 at which the driving signal is obtained. The drain of the transistor Q2 is connected to the third node N3, the source thereof is connected to the earth (Vss), and the gate thereof is connected to the drain of the transistor Q3. The drain of the transistor Q3 is connected to the first node N1, the source thereof is connected to the earth (Vss), and the gate thereof is connected to the second node N2.

The following description of operation is based on the use of N-channel MOS transistors as the internal transistors Q1 to Q3.

In FIG. 4 which shows a timing diagram in a so-called hidden-refresh mode: (a) shows an inverted signal of a Row Address Strobe signal (hereinafter referred to as $\overline{RAS}$); (b) shows an inverted signal of a Column Address Strobe signal (hereinafter referred to as "$\overline{CAS}$"); (c) shows an address signal Ai from the outside; (d) shows a signal at the internal node N1; (e) shows a signal at the internal node N2; (f) shows a driving signal at the internal node N3; (g) and (h) show the outputs D and $\overline{D}$ from the pre-amplifier 11, respectively; and (i) shows the output data Do.

Hereupon, the hidden-refresh is operated in such a manner that when the $\overline{RAS}$ signal falls down on a condition that the $\overline{CAS}$ signal is low, a refreshing of all the memory cells which have the row address designated by the row address signal is executed and completed at the time when the $\overline{RAS}$ signal rises up. On the other hand, at a time when the $\overline{CAS}$ signal falls down while the $\overline{RAS}$ signal is low, data of the memory cell which has the row and column address designated by the address signal at that time is output from the memory as the output data Do. The "hidden-refresh" means that the refreshing of the memory cells is executed while data is output from the memory.

At first the operations of the pre-amplifier 11 and the main-amplifier 12 are described with reference to FIG. 5, wherein (a) shows the $\overline{RAS}$ signal, the (b) shows the $\overline{CAS}$ signal; (c) and (d) show the signals of the I/O bus line 23 and $\overline{I/O}$ bus line 24 respectively; (e) shows a set signal $\phi s$ input to the pre-amplifier 11; (f) shows a signal at the node N4; (g) shows a signal $\phi c$ input to the pre-amplifier 11; (h) and (i) shows the outputs D and $\overline{D}$ from the pre-amplifier 11 respectively; (j) shows the driving output at the node N3; (k) and (l) show signals at the node N7 and N8 respectively; and (m) shows the data output Do of the driving circuit 13.

The information stored in the memory cell selected among the memory cells of the memory cell array 21 is transmitted to the I/O bus line 23 and $\overline{I/O}$ bus line 24 as complimentary signals (refer to FIG. 5(c), (d)) through the I/O control circuit 22. The I/O bus line 23 and the $\overline{I/O}$ bus line 24 are connected to the drains of the transistors Q5 and Q6 respectively, both of which constitute a flip-flop in the pre-amplifier 11. The flip-flop is activated by the rising of a set signal $\phi s$ (refer to FIG. 5(e)) input to the pre-amplifier 11 which signal turns on the transistor Q21, thereby making the node N4 discharge. The nodes N5 and N6 are pre-charged to a high voltage through the transistors Q7 and Q8 by the pre-charge signal $\phi p$, respectively. Now it is supposed that the I/O bus line 23 is at "H" (high level), the $\overline{I/O}$ bus line 24 is at "L" (low level), and these signals are amplified by the flip-flop, then the transistor Q9 is turned off, the transistor Q10 is turned on, and the node N6 is discharged to the earth through the transistors Q10 and Q21. The transistor Q11, connected between the node N5 and the output D, and the transistor Q12, connected between the node N6 and the output $\overline{D}$, are both cut-off transistors. This enhances the boot-strap effect of the main-amplifier 12.

In the main-amplifier 12, the voltage at the driving output node N3 rises at the time when the outputs D, $\overline{D}$ of the pre-amplifier 11 are transmitted to the gates of the transistors Q13, Q14, whereby the voltages of the nodes N7, N8 are determined in accordance with the outputs D, $\overline{D}$ of the pre-amplifier 11 (refer to FIG. 5(k), (l)). The voltages of the nodes N7, N8 are amplified by the transistors Q15, Q16 in flip-flop connection. The transistors Q17 and Q18 are arranged so as to discharge completely the gate voltage of either of the transistors Q13 and Q14 which is in OFF state. Either of the output transistors Q19, Q20 is turned on in accordance with the voltage of the nodes N7, N8, thereby determining the level of data output Do (refer to FIG. 5(m)).

The circuit of FIG. 1 will be operated as follows:

When the hidden-refresh operation is started, the node N2 (refer to FIG. 4(e)) becomes "H", and the transistor Q3 is turned on, making the node N1 (refer to FIG. 4(d)) "L". When the node N1 becomes "L", the transistor Q2 is turned off, thereby rising the level of driving output N3. The $\overline{RAS}$ signal (refer to FIG. 4(a)) arises making the node N2 "L", whereby the outputs D, $\overline{D}$ of the pre-amplifier 11 are reset.

The mode shown in FIG. 4 is that where the $\overline{CAS}$ signal is made "L" in the first cycle, the column addresses are taken out to execute a read-out cycle, thereby maintaining the output data Do as it is, and thereafter the $\overline{RAS}$-only-refresh is continued with the $\overline{CAS}$ signal being held at "L" in the usual $\overline{RAS}$-only-refresh mode. Meanwhile, the output data Do from the main-amplifier 12 is held.

At this stage, it is necessary to keep the driving output for driving the main-amplifier 12 at the node N3 (refer to FIG. 4(f)) at "H" in order to keep the output data Do (refer to FIG. 4(i)). It is necessary that the transistor Q2 of the driver circuit 13 be placed in a completely OFF state in order to keep the driving output N3 at "H".

However, the voltage of the node N2 which is connected to the gate of the transistor Q3 which is arranged so as to place the node N1 to the earth, which node (N1) is connected to the gate of the transistor Q2, will become "L" at the rising of the $\overline{RAS}$ signal shown in FIG. 4(a), as apparent from FIG. 4(e), with keeping the state "L" during the hidden-refresh mode. Accordingly, the "L" level of the node N1 (refer to FIG. 4(d)) is an unstable one which is not connected to the earth (Vss) during the hidden-refresh. As the $\overline{RAS}$ system circuit operates periodically during the hidden-refresh, the voltage of the node N1 varies to the plus side caused by the coupling of noise voltages that arise accompanying the circuit operation of the $\overline{RAS}$ system circuit, thereby decreasing the voltage of the driving output N3. The outputs D and $\overline{D}$ of the pre-amplifier 11 (refer to FIG. 4(g), (h)) are reset by the rising of the $\overline{RAS}$ signal (refer to FIG. 4(a)).

Under such construction shown in FIG. 1, the voltage of the driving output N3 decreases during the hidden-refresh operation, unfavorably affecting the holding of the level of output data Do.

OBJECTS AND SUMMARY OF THE INVENTION

The present invention is directed to solve the problems pointed out above, and has for its object of provide a dynamic random access memory capable of holding the level of output data in the hidden-refresh operation.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to one aspect of the present invention, there is provided a d-RAM wherein a transistor, to the gate whereof the driving output is supplied, is connected between the gate of the driving transistor of the driver circuit and the earth, whereby a latch circuit is constituted between the node of the driving output and the gate of the driving transistor.

BRIEF DESCRIPTION OF THE DRAWINGS

FIG. 6 is a circuit diagram of a d-RAM as one embodiment of the present invention.

DETAILED DESCRIPTION OF THE PREFERRED EMBODIMENTS

Figure 1:
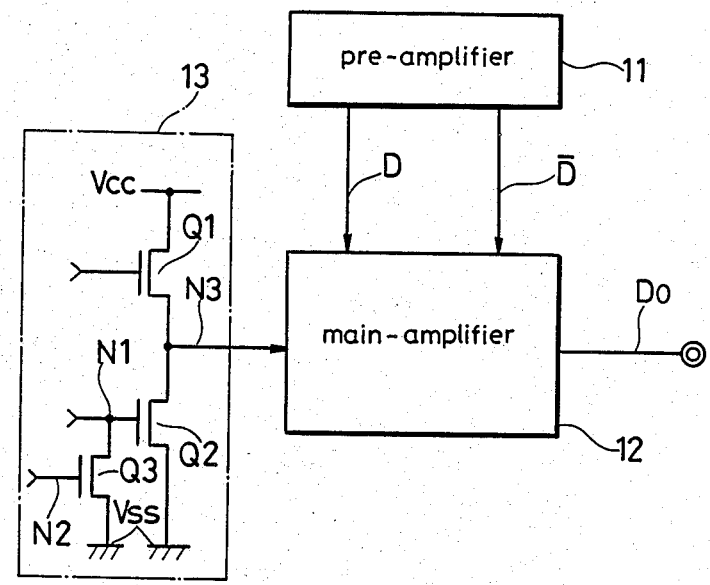
FIG. 1 is a circuit diagram showing a conventional d-RAM.
Figure 2:
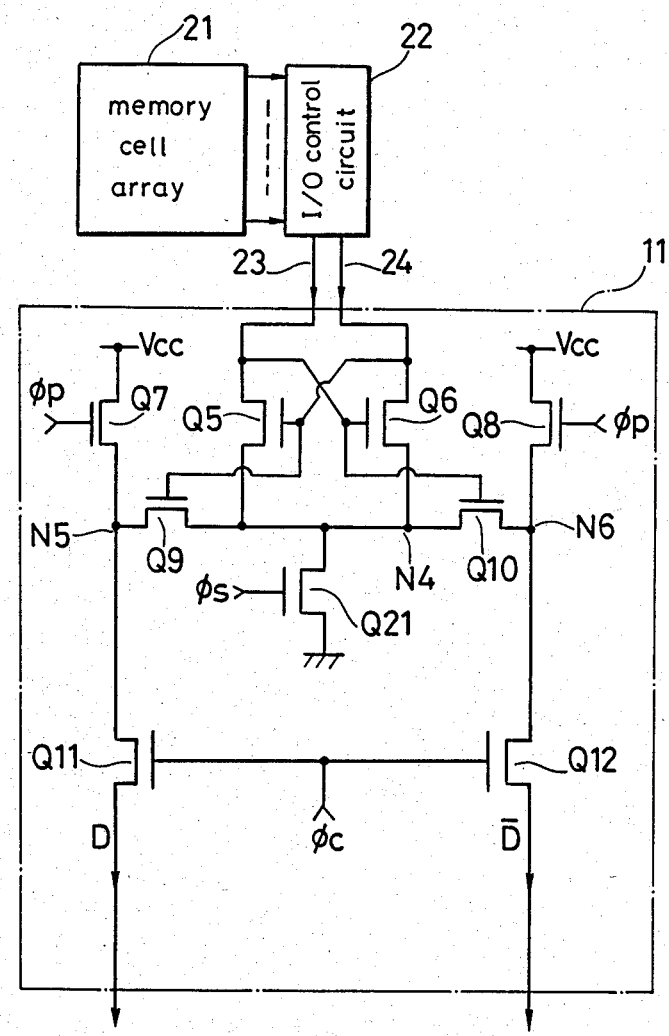
FIG. 2 is a circuit diagram of the pre-amplifier of FIG. 1.
Figure 3:
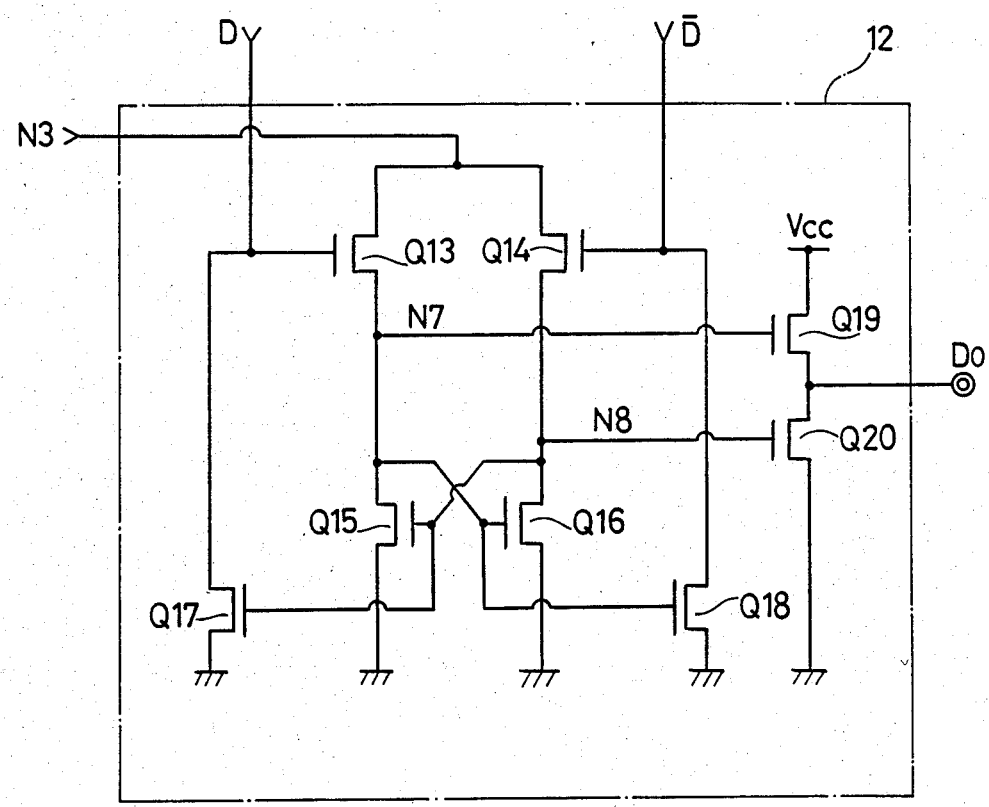
FIG. 3 is a circuit diagram of the main-amplifier of FIG. 1.
Figure 4:
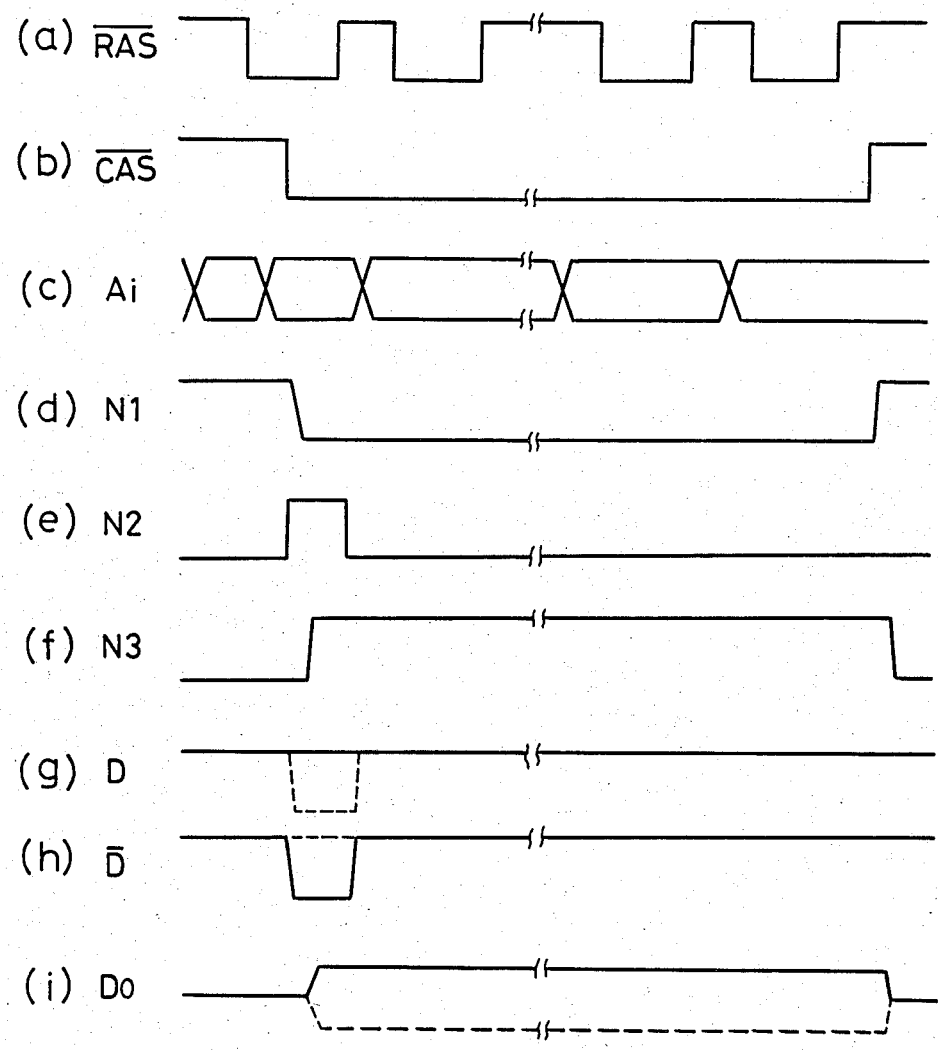
FIG. 4(a thru i) is a timing diagram exemplifying an operation of FIG. 1 in the hidden-refresh mode.
Figure 5:
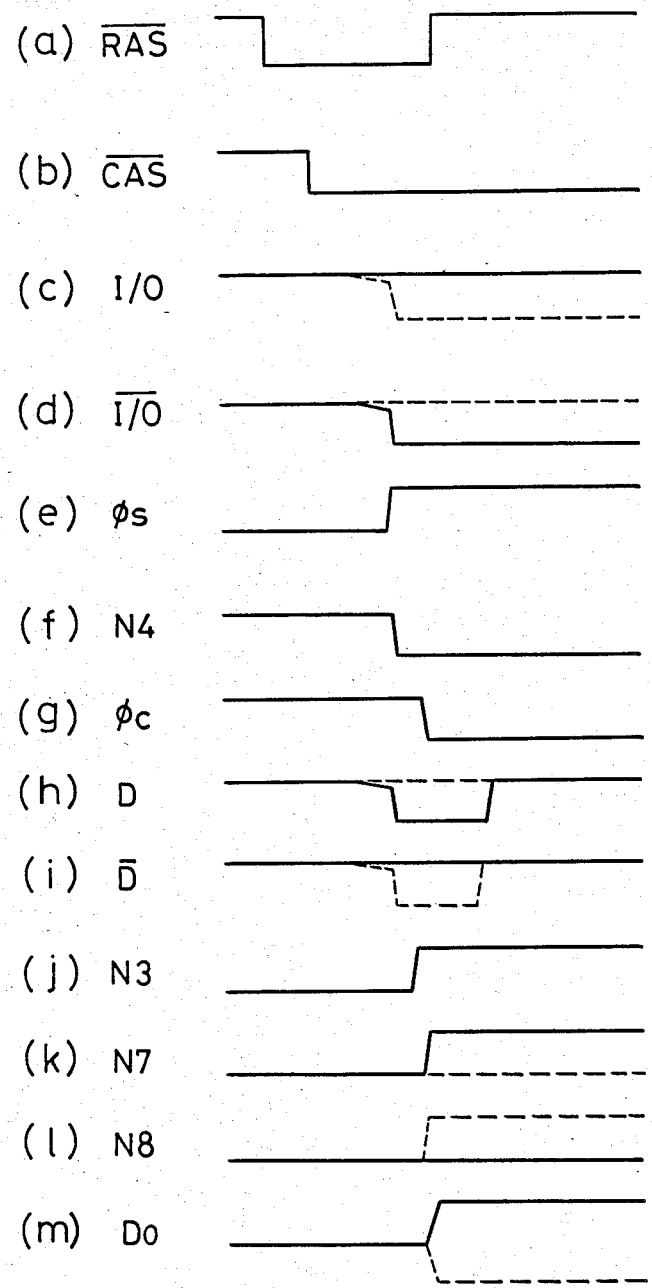
FIG. 5(a thru m) is a timing diagram exemplifying operations of the pre- and main-amplifiers.

Reference will now be made to FIG. 6, wherein like reference numerals are used to designate like or corresponding parts or elements through FIGS. 1 to 3. The reference character Q4 designates a transistor to the gate whereof the driving output at the node N3 is supplied, with the drain thereof being connected to the node N1, and with the source thereof being connected to the earth (Vss).

The drain of the transistor Q1 is connected to the power supply (Vcc) terminal and the source thereof is connected to the third node N3 whereat the driving output is obtained. The drain of the transistor (first transistor) Q2 is connected to the third node N3, the source thereof is connected to the earth (Vss), and the gate thereof is connected to the drain of the transistor (second transistor) Q4. The drain of the transistor Q3 is connected to the node N1, the source thereof is connected to the earth (Vss), and the gate thereof is connected to the second node N2.

The device of FIG. 6 is operated as follows:

The operations of the pre- and main-amplifiers 11, 12 and the operation from the start of the hidden-refresh to the reset of the outputs D, $\overline{D}$ of the pre-amplifier 11 by the $\overline{RAS}$ signal is the same as above, as described concerned with the conventional device.

The transistor Q4 is held at its ON state while the driving output N3 is held "H" after the outputs D, D of the pre-amplfer 11 are reset, whereby the node N1 is connected to the earth (Vss), and the voltage of the node N1 does not rise, regardless of the couplings of noise accompanying with the operation of the $\overline{RAS}$ system circuit.

Accordingly, the transistor Q2 is held at its OFF state during the hidden-refresh operation, whereby the driving output N3 is held at "H" and the output data Do from the main-amplifier 12 is maintained at its level. This is caused by the operation of a latch circuit constituted by the nodes N1, N2 and transistors Q4, Q2.

The foregoing description is based on the use of N-channel MOS transistor circuits, but the present invention is not limited to such a construction it. P-channel MOS transistor circuits and complimentary MOS transistor circuits can be similarly used.

As is evident from the foregoing description, according to the present invention, a latch is constituted between the node whereat the driving output is obtained and the gate of the driving transistor, thereby realizing a d-RAM wherein the level of output data does not decrease in the hidden-refresh operation.

What is claimed is:

1. A dynamic random access memory comprising:
at least one memory cell;
pre-amplifier means for amplifying data which is read out from a memory cell accessed by an address signal;
main-amplifier means for amplifying an output of the pre-amplifier and outputing an amplified signal;
driver circuit means for outputting a driving signal for driving the main-amplifier means,
said driver circuit means including a first and a second transistor, wherein a drain of the first transistor is connected to a node corresponding to an output terminal of the driver circuit, with a source of the first transistor being earthed and with a gate thereof being connected to a drain of the second transistor, and wherein a gate of the second transistor is connected to the node with the source thereof being earthed.

* * * * *